US012447578B2

(12) United States Patent
Xu et al.

(10) Patent No.: US 12,447,578 B2
(45) Date of Patent: Oct. 21, 2025

(54) COMPENSATION FOR SUBSTRATE DOPING IN EDGE RECONSTRUCTION FOR IN-SITU ELECTROMAGNETIC INDUCTIVE MONITORING

(71) Applicant: APPLIED MATERIALS, INC., Santa Clara, CA (US)

(72) Inventors: Kun Xu, Sunol, CA (US); David Maxwell Gage, Sunnyvale, CA (US); Harry Q. Lee, Los Altos, CA (US); Denis Anatolyevich Ivanov, St. Petersburg (RU); Hassan G. Iravani, Sunnyvale, CA (US); Doyle E. Bennett, Santa Clara, CA (US); Kiran Lall Shrestha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 900 days.

(21) Appl. No.: 17/280,163

(22) PCT Filed: Sep. 26, 2018

(86) PCT No.: PCT/RU2018/000625
§ 371 (c)(1),
(2) Date: Mar. 25, 2021

(87) PCT Pub. No.: WO2020/067914
PCT Pub. Date: Apr. 2, 2020

(65) Prior Publication Data
US 2021/0379723 A1 Dec. 9, 2021

(51) Int. Cl.
*B24B 37/013* (2012.01)
*B24B 1/00* (2006.01)
(Continued)

(52) U.S. Cl.
CPC ........... *B24B 37/013* (2013.01); *B24B 1/002* (2013.01); *B24B 37/005* (2013.01);
(Continued)

(58) Field of Classification Search
CPC ..... B23B 37/04; B23B 37/005; B23B 37/013; B24B 49/105; B24B 49/10
(Continued)

(56) References Cited

U.S. PATENT DOCUMENTS

| 5,433,651 A | 7/1995 | Lustig |
| 5,559,428 A | 9/1996 | Li et al. |

(Continued)

FOREIGN PATENT DOCUMENTS

| CN | 1860584 | 11/2006 |
| CN | 201166564 | 12/2008 |

(Continued)

OTHER PUBLICATIONS

Office Action in Japanese Appln. No. 2021-515511, dated Oct. 25, 2022, 10 pages (With English translation).

(Continued)

*Primary Examiner* — Makena S Markman
(74) *Attorney, Agent, or Firm* — Fish & Richardson P.C.

(57) ABSTRACT

A method of compensating for a contribution of conductivity of the semiconductor wafer to a measured trace by an in-situ electromagnetic induction monitoring system includes storing or generating a modified reference trace. The modified reference trace represents measurements of a bare doped reference semiconductor wafer by an in-situ electromagnetic induction monitoring system as modified by a neutral network. The substrate is monitored with an in-situ electromagnetic induction monitoring system to generate a measured trace that depends on a thickness of the conductive layer, and at least a portion of the measured trace is applied (Continued)

to a neural network to generate a modified measured trace. An adjusted trace is generated, including subtracting the modified reference trace from the modified measured trace.

24 Claims, 10 Drawing Sheets

(51) Int. Cl.
  *B24B 37/005* (2012.01)
  *B24B 37/04* (2012.01)
  *B24B 49/10* (2006.01)
  *G06N 3/08* (2023.01)
  *H01L 21/02* (2006.01)
  *H01L 21/66* (2006.01)

(52) U.S. Cl.
  CPC ...... *B24B 37/042* (2013.01); *H01L 21/02013* (2013.01); *H01L 22/20* (2013.01); *B24B 49/105* (2013.01); *G06N 3/08* (2013.01)

(58) Field of Classification Search
  USPC .......................................................... 451/5
  See application file for complete search history.

(56) References Cited

U.S. PATENT DOCUMENTS

| | | |
|---|---|---|
| 5,644,221 A | 7/1997 | Li et al. |
| 5,660,672 A | 8/1997 | Li et al. |
| 5,700,180 A | 12/1997 | Sandhu et al. |
| 5,832,466 A | 11/1998 | Feldgajer |
| 6,004,187 A | 12/1999 | Nyui et al. |
| 6,072,313 A | 6/2000 | Li et al. |
| 6,159,073 A | 12/2000 | Wiswesser et al. |
| 6,172,756 B1 | 1/2001 | Geels et al. |
| 6,179,709 B1 | 1/2001 | Redeker et al. |
| 6,190,234 B1 | 2/2001 | Swedek et al. |
| 6,280,289 B1 | 8/2001 | Wiswesser et al. |
| 6,296,548 B1 | 10/2001 | Wiswesser et al. |
| 6,399,501 B2 | 6/2002 | Birang et al. |
| 6,407,546 B1 | 6/2002 | Le et al. |
| 6,433,541 B1 | 8/2002 | Lehman et al. |
| 6,524,165 B1 | 2/2003 | Wiswesser et al. |
| 6,558,229 B2 | 5/2003 | Kimura et al. |
| 6,594,024 B1* | 7/2003 | Singh ............... G01N 21/47 451/6 |
| 6,602,724 B2 | 8/2003 | Redeker et al. |
| 6,707,540 B1 | 3/2004 | Lehman et al. |
| 6,924,641 B1 | 8/2005 | Hanawa et al. |
| 6,945,845 B2 | 9/2005 | Bennett et al. |
| 6,975,107 B2 | 12/2005 | Hanawa et al. |
| 7,001,243 B1 | 2/2006 | Yi et al. |
| 7,008,296 B2 | 3/2006 | Swedek et al. |
| 7,016,795 B2 | 3/2006 | Swedek et al. |
| 7,025,658 B2 | 4/2006 | David |
| 7,082,345 B2 | 7/2006 | Shanmugasundram et al. |
| 7,097,537 B1 | 8/2006 | David |
| 7,112,960 B2 | 9/2006 | Miller et al. |
| 7,153,185 B1 | 12/2006 | Birang et al. |
| 7,189,140 B1 | 3/2007 | Shugrue et al. |
| 8,010,222 B2 | 8/2011 | Lehman et al. |
| 8,106,651 B2 | 1/2012 | Lahiri et al. |
| 8,246,417 B2 | 8/2012 | Kobayashi et al. |
| 8,284,560 B2 | 10/2012 | Iravani et al. |
| 8,367,429 B2 | 2/2013 | Lee et al. |
| 8,408,965 B2 | 4/2013 | Bennett et al. |
| 9,142,466 B2 | 9/2015 | Lee et al. |
| 9,205,527 B2 | 12/2015 | Xu et al. |
| 9,281,253 B2 | 3/2016 | Xu et al. |
| 9,490,186 B2 | 11/2016 | Benvegnu et al. |
| 9,636,797 B2 | 5/2017 | Xu et al. |
| 10,478,937 B2 | 11/2019 | Tang et al. |
| 10,921,789 B2 | 2/2021 | Kadokura |
| 10,994,389 B2 | 5/2021 | Xu et al. |
| 11,524,382 B2 | 12/2022 | Xu et al. |
| 11,580,375 B2 | 2/2023 | Bhaskar et al. |
| 11,618,499 B2 | 4/2023 | Bouchet |
| 11,780,047 B2 | 10/2023 | Xu et al. |
| 2001/0008827 A1 | 7/2001 | Kimura et al. |
| 2002/0002029 A1 | 1/2002 | Kimura et al. |
| 2002/0013007 A1 | 1/2002 | Hasegawa et al. |
| 2002/0013124 A1 | 1/2002 | Tsujimura et al. |
| 2002/0055192 A1 | 5/2002 | Redeker et al. |
| 2002/0077031 A1 | 6/2002 | Johansson et al. |
| 2002/0098777 A1 | 7/2002 | Laursen et al. |
| 2002/0103564 A1 | 8/2002 | Fielden et al. |
| 2002/0155789 A1 | 10/2002 | Bibby, Jr. et al. |
| 2002/0164925 A1 | 11/2002 | Swedek et al. |
| 2002/0192966 A1 | 12/2002 | Shanmugasundram et al. |
| 2003/0028279 A1 | 2/2003 | Wang et al. |
| 2003/0053042 A1 | 3/2003 | Chen |
| 2003/0087459 A1 | 5/2003 | Laursen et al. |
| 2004/0119468 A1 | 6/2004 | Gotkis et al. |
| 2004/0259470 A1* | 12/2004 | Swedek ............... B24B 37/013 451/41 |
| 2005/0018183 A1 | 1/2005 | Shortt |
| 2005/0024047 A1 | 2/2005 | Miller et al. |
| 2006/0009132 A1 | 1/2006 | Bennett et al. |
| 2007/0061036 A1 | 3/2007 | Sakurai et al. |
| 2007/0103150 A1 | 5/2007 | Tada et al. |
| 2007/0205765 A1 | 9/2007 | Bailey |
| 2007/0251922 A1 | 11/2007 | Swedek et al. |
| 2008/0057830 A1 | 3/2008 | Molnar |
| 2008/0139087 A1 | 6/2008 | Togawa et al. |
| 2008/0183312 A1 | 7/2008 | Funk et al. |
| 2009/0104847 A1* | 4/2009 | Kobayashi ............ B24B 49/105 451/5 |
| 2009/0156098 A1 | 6/2009 | Swedek et al. |
| 2009/0263918 A1 | 10/2009 | Lahiri et al. |
| 2009/0299930 A1 | 12/2009 | Konermann et al. |
| 2010/0094790 A1 | 4/2010 | Gnojewski |
| 2010/0099334 A1 | 4/2010 | Bennett et al. |
| 2011/0124269 A1 | 5/2011 | Tada et al. |
| 2011/0189925 A1 | 8/2011 | Iravani et al. |
| 2011/0318992 A1 | 12/2011 | David et al. |
| 2012/0034845 A1 | 2/2012 | Hu et al. |
| 2012/0064800 A1 | 3/2012 | Watanabe et al. |
| 2012/0276661 A1 | 11/2012 | Iravani et al. |
| 2013/0000845 A1 | 1/2013 | Lu et al. |
| 2013/0273812 A1 | 10/2013 | Qian et al. |
| 2013/0337722 A1 | 12/2013 | Namiki et al. |
| 2015/0118765 A1 | 4/2015 | Xu et al. |
| 2015/0118766 A1 | 4/2015 | Xu et al. |
| 2015/0224623 A1 | 8/2015 | Xu et al. |
| 2015/0371907 A1 | 12/2015 | Lu et al. |
| 2015/0371913 A1 | 12/2015 | Zhefu et al. |
| 2016/0016279 A1 | 1/2016 | Gurusamy et al. |
| 2016/0361791 A1 | 12/2016 | Economikos et al. |
| 2018/0056476 A1 | 3/2018 | Zhang et al. |
| 2018/0203089 A1 | 7/2018 | Xu et al. |
| 2018/0203090 A1 | 7/2018 | Xu et al. |
| 2018/0304435 A1 | 10/2018 | Xu et al. |
| 2019/0095797 A1 | 3/2019 | Dhandapani et al. |
| 2019/0120610 A1 | 4/2019 | Wu et al. |
| 2019/0299356 A1 | 10/2019 | Xu et al. |
| 2020/0101579 A1 | 4/2020 | Suzuki |
| 2020/0130136 A1 | 4/2020 | Huang et al. |
| 2020/0398890 A1 | 12/2020 | Bouchet |
| 2021/0229234 A1 | 7/2021 | Xu et al. |
| 2021/0402551 A1 | 12/2021 | Xu et al. |
| 2022/0115275 A1* | 4/2022 | Pandit ............... H01J 37/3299 |
| 2023/0085787 A1 | 3/2023 | Xu et al. |
| 2023/0381912 A1 | 11/2023 | Xu et al. |

FOREIGN PATENT DOCUMENTS

| | | |
|---|---|---|
| CN | 101978486 | 2/2011 |
| CN | 102278967 | 12/2011 |
| CN | 102398210 | 4/2012 |
| CN | 102626895 | 8/2012 |
| CN | 102683237 | 9/2012 |
| CN | 105659363 | 6/2016 |
| CN | 106625201 | 5/2017 |

(56) References Cited

FOREIGN PATENT DOCUMENTS

| | | |
|---|---|---|
| CN | 107369635 | 11/2017 |
| CN | 108573310 | 9/2018 |
| CN | 111185845 | 5/2020 |
| EP | 0738561 | 10/1996 |
| EP | 1063056 | 12/2000 |
| JP | 2004-525521 | 8/2004 |
| JP | 2005-034992 | 2/2005 |
| JP | 2005-518654 | 6/2005 |
| JP | 2007-501509 | 1/2007 |
| JP | 2007-083359 | 4/2007 |
| JP | 2007-523756 | 8/2007 |
| JP | 2009-004442 | 1/2009 |
| JP | 2009-099842 | 5/2009 |
| JP | 2011-023579 | 2/2011 |
| JP | 2011-164110 | 8/2011 |
| JP | 2012-506152 | 3/2012 |
| JP | 2014-096585 | 5/2014 |
| JP | 2016-538728 | 12/2016 |
| JP | 2017-506438 | 3/2017 |
| JP | 2019-139755 | 8/2019 |
| JP | 2021-515511 | 6/2021 |
| KR | 10-0769566 | 10/2007 |
| KR | 10-2008-0082012 | 9/2008 |
| KR | 10-2009-0057306 | 6/2009 |
| KR | 10-2011-0084947 | 7/2011 |
| KR | 10-2016-0052216 | 5/2016 |
| KR | 10-2016-0078473 | 7/2016 |
| KR | 10-2016-0103791 | 9/2016 |
| KR | 10-2016-0148676 | 12/2016 |
| KR | 10-2017-0015406 | 2/2017 |
| KR | 10-2017-0071609 | 6/2017 |
| KR | 10-2020-0047739 | 5/2020 |
| TW | 393563 | 6/2000 |
| TW | I221435 | 10/2004 |
| TW | 201249598 | 12/2012 |
| TW | 201400239 | 1/2014 |
| TW | 201842471 | 12/2018 |
| TW | 201945118 | 12/2019 |
| WO | WO 1997/021070 | 6/1997 |
| WO | WO 2001/046684 | 6/1999 |
| WO | WO 2002/087825 | 11/2002 |
| WO | WO 2004/059242 | 7/2004 |
| WO | WO 2008/032753 | 1/2008 |
| WO | WO 2012/148716 | 11/2012 |
| WO | WO 2020/067914 A8 | 4/2020 |
| WO | WO 2018/102222 | 6/2022 |

OTHER PUBLICATIONS

Notice of Allowance in Japanese Appln. No. 2021-515511, dated Nov. 7, 2023, 5 pages (with English translation).

Zhang et al, "Artificial Neural Network Modeling For Experiments of Electrical Discharge Grinding of Polycrystalline Diamond," Diamond & Abrasives Engineering, Jun. 30, 2004, 141(3):14-16 (with English abstract).

Office Action in Korean Appln. No. 10-2021-7011833, dated Mar. 31, 2023, 13 pages (with English translation).

Zheng et al., "Research on Oil Film Thickness Measuring System of the Thrust Bearing Test Board," Large Electric Machine and Hydraulic Turbine, Jan. 29, 2001, 9 pages (with English translation).

Office Action in Chinese Appln. No. 201880083574.6, dated Nov. 28, 2023, 16 pages (with English translation).

PCT International Search Report and Written Opinion in related International Application No. PCT/RU2018/00625, dated May 13, 2019, 13 pages.

Notice of Allowance in Korean Appln. No. 10-2024-7003246, dated Oct. 16, 2024, 6 pages (with English translation).

\* cited by examiner

COMPENSATION FOR SUBSTRATE DOPING IN EDGE RECONSTRUCTION FOR IN-SITU ELECTROMAGNETIC INDUCTIVE MONITORING

CROSS-REFERENCE TO RELATED APPLICATION

This application is a U.S. National Stage Application under 35 USC § 371 and claims the benefit of International Patent Application No. PCT/RU2018/000625 filed on Sep. 26, 2018. The foregoing application is hereby incorporated by reference in its entirety.

TECHNICAL FIELD

The present disclosure relates to chemical mechanical polishing, and more specifically to monitoring of a conductive layer during chemical mechanical polishing.

BACKGROUND

An integrated circuit is typically formed on a substrate by the sequential deposition of conductive, semiconductive, or insulative layers on a silicon wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. Polishing slurry with abrasive particles is typically supplied to the surface of the polishing pad.

One problem in CMP is determining whether the polishing process is complete, i.e., whether a substrate layer has been planarized to a desired flatness or thickness, or when a desired amount of material has been removed. Variations in the slurry composition, the polishing pad condition, the relative speed between the polishing pad and the substrate, the initial thickness of the substrate layer, and the load on the substrate can cause variations in the material removal rate. These variations cause variations in the time needed to reach the polishing endpoint. Therefore, determining the polishing endpoint merely as a function of polishing time can lead to non-uniformity within a wafer or from wafer to wafer.

In some systems, a substrate is monitored in-situ during polishing, e.g., through the polishing pad. One monitoring technique is to induce an eddy current in the conductive layer and detect the change in the eddy current as the conductive layer is removed.

SUMMARY

In one aspect, a method of compensating for a contribution of conductivity of the semiconductor wafer to a measured trace by an in-situ electromagnetic induction monitoring system includes storing or generating a modified reference trace representing measurements of a bare doped reference semiconductor wafer by an in-situ electromagnetic induction monitoring system as modified by a neutral network, monitoring the substrate with an in-situ electromagnetic induction monitoring system as the conductive layer to generate a measured trace that depends on a thickness of the conductive layer, applying at least a portion of the measured trace to a neural network to generate a modified measured trace, and generating an adjusted trace, including subtracting the modified reference trace from the modified measured trace.

In one aspect, a method of polishing a substrate includes storing or generating a modified reference trace representing measurements of a bare doped reference semiconductor wafer by an in-situ electromagnetic induction monitoring system as modified by a neutral network, bringing a substrate having a conductive layer disposed over a semiconductor wafer into contact with a polishing pad, generating relative motion between the substrate and the polishing pad, monitoring the substrate with the in-situ electromagnetic induction monitoring system as the conductive layer is polished to generate a measured trace that depends on a thickness of the conductive layer, applying at least a portion of the measured trace to a neural network to generate a modified measured trace, generating an adjusted trace to at least partially compensate for a contribution of conductivity of the semiconductor wafer to the measured trace including subtracting the modified reference trace from the modified measured trace, and at least one of halting polishing or modifying a polishing parameter based on the adjusted trace.

Each of these aspects may also be applied as a computer program product, tangibly encoded on a computer readable media including instructions to cause a computer system to carry out appropriate operations (e.g., storing or generating the modified reference trace, applying the measured trace, and generating the adjusted trace), or as a polishing system including a controller configured to carry out appropriate operations.

Implementations of the methods, the computer program products, and/or the systems may include one or more of the following features.

The modified reference trace may include a sequence of equivalent thickness values, and the modified measured trace may include a sequence of actual thickness values. At least a portion of an initial reference trace may be applied to the neural network to generate the modified reference trace. Raw signal values in a preliminary reference trace may be converted to thickness values to generate the initial reference trace. User input may be received selecting a reference trace from a plurality of reference traces. Generating the modified reference trace may include scanning a sensor of an in-situ electromagnetic induction monitoring system across the bare doped reference semiconductor wafer.

Generating the adjusted trace may include scaling a difference between the modified reference trace and the modified measured trace. The adjusted trace A(x) may be calculated such that A(x)=(T(x)−S(x)−b)/k where T(x) is the modified measured trace, S(x) is the modified reference trace, and b and k are constants. The constants b and k according to a configuration of the sensor of the in-situ monitoring system.

The at least a portion of the measured trace applied to the neural network may include a portion corresponding to an edge region of the substrate. The at least a portion of the measured trace applied to the neural network need not includes a portion corresponding to a central region of the substrate. The neural network may be trained with a plurality of training traces representing measurements of one or more training substrates having a conductive layer on an undoped semiconductor wafer with different training traces corresponding to different thickness of the conductive layer and different edge profiles.

Implementations may include one or more of the following advantages. During monitoring of processing, e.g., polishing, of a substrate, possible inaccuracy of the correlation between a measured eddy current signal and a conductive layer thickness caused by doping of an underlying semiconductor wafer can be mitigated, particularly at the edge of the substrate. An adjusted eddy current signal or an adjusted conductive layer thickness using the compensating processes can be more accurate. The system can compensate for distortions in a portion of the signal that corresponds to the substrate edge. The adjusted eddy current signal and/or the adjusted conductive layer can be used for determining control parameters during a polishing process and/or determining an endpoint for the polishing process. Reliability of the control parameter determination and endpoint detection can be improved, wafer under-polish can be avoided, and within-wafer non-uniformity can be reduced.

The details of one or more implementations are set forth in the accompanying drawings and the description below. Other aspects, features, and advantages will be apparent from the description and drawings, and from the claims.

DETAILED DESCRIPTION

Figure 1:
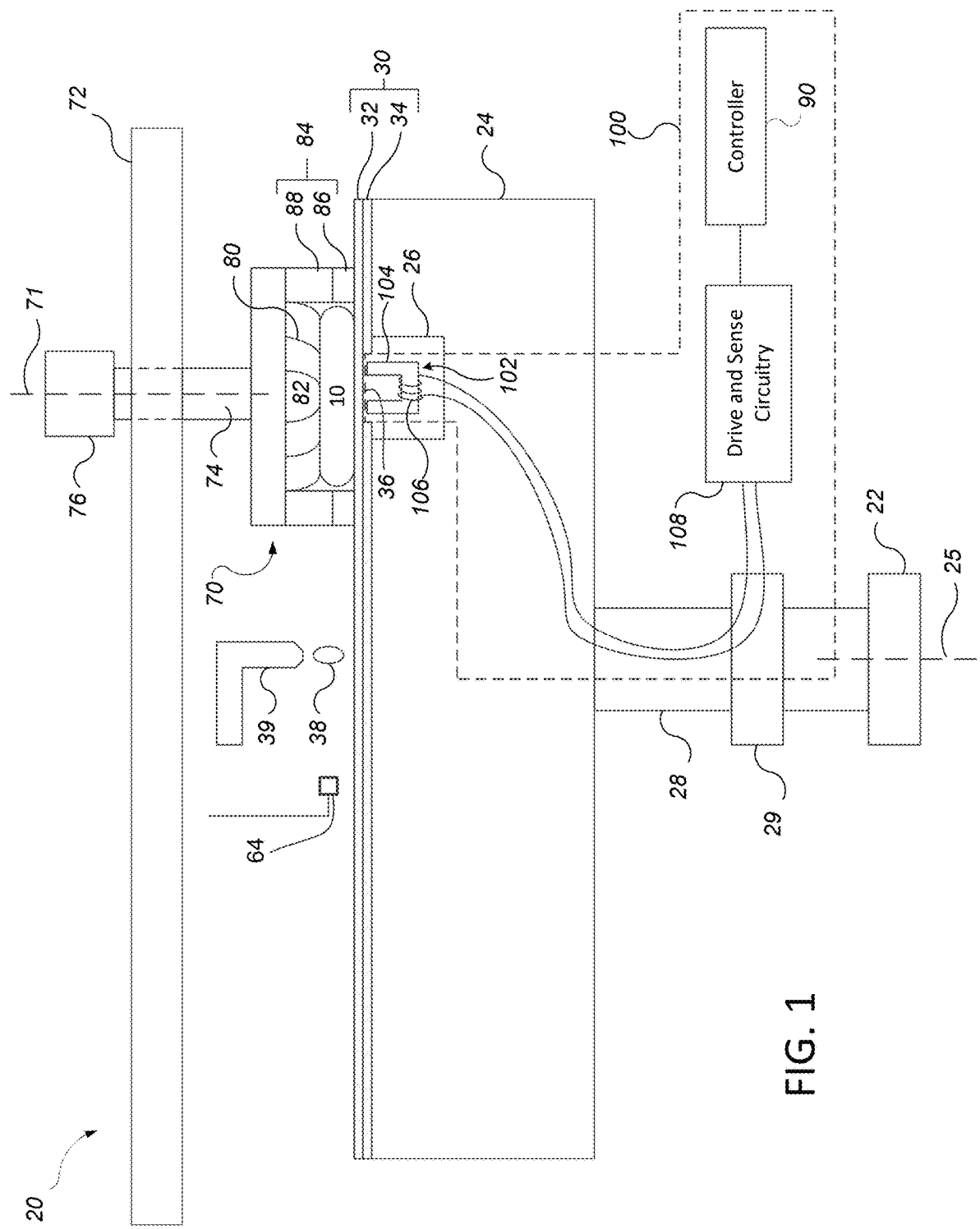
FIG. 1 illustrates a schematic cross-sectional view of an example of a polishing station including an electromagnetic induction monitoring system.

One monitoring technique for a polishing operation is to induce currents in a conductive layer on a substrate. The induced currents can be measured by an inductive monitoring system in-situ during polishing to generate a signal. Assuming the outermost layer undergoing polishing is a conductive layer, then the signal from the sensor should be dependent on the thickness of the conductive layer. Based on the monitoring, control parameters for the polishing can be adjusted, e.g., so that the locations of the layer are substantially the same thickness after polishing or so that polishing of the locations of the layer completes at about the same time. Such profile control can be referred to as real time profile control (RTPC). In addition, the polishing operation can terminate based on an indication that the monitored thickness has reached a desired endpoint thickness.

An in-situ monitoring system can be subject to signal distortion for measurements at locations close to the substrate edge. For example, the inductive monitoring system can generate a magnetic field. Near the substrate edge, the signal can be artificially low because the magnetic field only partially overlaps the conductive layer of the substrate. Various techniques can be used to compensate for distortions. For example, the signal can be fed into an artificial neural network to generate a modified signal.

In practice, the magnetic field generated by the eddy current sensor does not stop within the conductive layer, but can extend into the underlying substrate. Without being limited to any particular theory, the skin depth in these magnetic permeable materials for the electromagnetic frequency employed in eddy current sensor can be larger than thickness of the conductive layer and the underlying semiconductor wafer. As a result, the signal generated by the eddy current sensor can depend on the conductivity of the semiconductor wafer.

If the semiconductor wafer is not doped, e.g., as typically used in "blank" wafers used for system calibration and basic substrate wafers, the electrical resistance of the wafer can be sufficiently high that the presence of the wafer does not have detectable influence on the eddy current signal. However, for actual device fabrication the wafers will typically be doped, e.g., highly doped, for various purposes. In this situation, the signal generated by the eddy current sensor can have significant contribution from the wafer, depending on the conductivity of the semiconductor wafer. As such, thickness measurement based on signals captured by the eddy current sensor can be inaccurate. Techniques can be used to compensate for this inaccuracy, e.g., by taking into account the contribution to the signal from the semiconductor wafer. However, such compensations can introduce additional errors at the substrate edge when edge reconstruction techniques are utilized.

However, a trace from the substrate and a trace from a doped wafer can be run separately through the edge reconstruction algorithm. The modified doped wafer trace can be subtracted from the modified measured substrate trace; the resulting difference will be closer to the actual thickness of the layer being polished. In addition, the difference can be scaled to compensate for sensor configurations.

Figure 2:
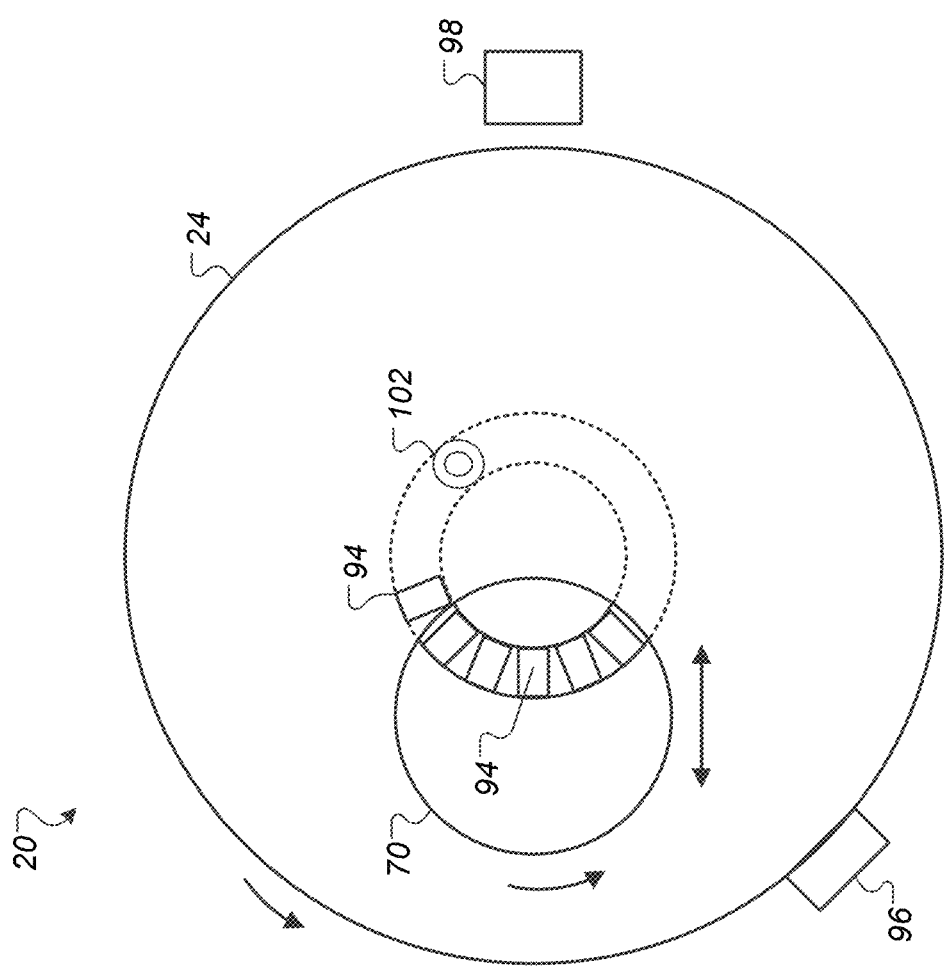
FIG. 2 illustrates a schematic top view of an example chemical mechanical polishing station.

FIGS. 1 and 2 illustrate an example of a polishing station 20 of a chemical mechanical polishing system. The polishing station 20 includes a rotatable disk-shaped platen 24 on which a polishing pad 30 is situated. The platen 24 is operable to rotate about an axis 25. For example, a motor 22 can turn a drive shaft 28 to rotate the platen 24. The polishing pad 30 can be a two-layer polishing pad with an outer polishing layer 34 and a softer backing layer 32.

The polishing station 20 can include a supply port or a combined supply-rinse arm 39 to dispense a polishing liquid 38, such as an abrasive slurry, onto the polishing pad 30. The polishing station 20 can include a pad conditioner apparatus with a conditioning disk to maintain the surface roughness of the polishing pad.

A carrier head 70 is operable to hold a substrate 10 against the polishing pad 30. The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel, by movement along the track, or by rotational oscillation of the carousel itself.

The carrier head 70 can include a retaining ring 84 to hold the substrate. In some implementations, the retaining ring 84 may include a highly conductive portion, e.g., the carrier ring can include a thin lower plastic portion 86 that contacts the polishing pad, and a thick upper conductive portion 88. In some implementations, the highly conductive portion is a metal, e.g., the same metal as the layer being polished, e.g., copper.

In operation, the platen is rotated about its central axis 25, and the carrier head is rotated about its central axis 71 and translated laterally across the top surface of the polishing pad 30. Where there are multiple carrier heads, each carrier head 70 can have independent control of its polishing parameters, for example each carrier head can independently control the pressure applied to each respective substrate.

The carrier head 70 can include a flexible membrane 80 having a substrate mounting surface to contact the back side of the substrate 10, and a plurality of pressurizable chambers 82 to apply different pressures to different zones, e.g., different radial zones, on the substrate 10.

In some implementations, the polishing station 20 includes a temperature sensor 64 to monitor a temperature in the polishing station or a component of/in the polishing station. Although illustrated in FIG. 1 as positioned to monitor the temperature of the polishing pad 30 and/or slurry 38 on the pad 30, the temperature sensor 64 could be positioned inside the carrier head 70 to measure the temperature of the substrate 10. The temperature sensor 64 can be in direct contact (i.e., a contacting sensor) with the polishing pad or the outermost layer of the substrate 10, which can be a conductive layer, to accurately monitor the temperature of the polishing pad or the outmost layer of the substrate. The temperature sensor can also be a non-contacting sensor (e.g., an infrared sensor). In some implementations, multiple temperature sensors are included in the polishing station 22, e.g., to measure temperatures of different components of/in the polishing station. The temperature(s) can be measured in real time, e.g., periodically and/or in association with the real-time measurements made by the eddy current system. The monitored temperature(s) can be used in adjusting the eddy current measurements in-situ.

Figure 3A:
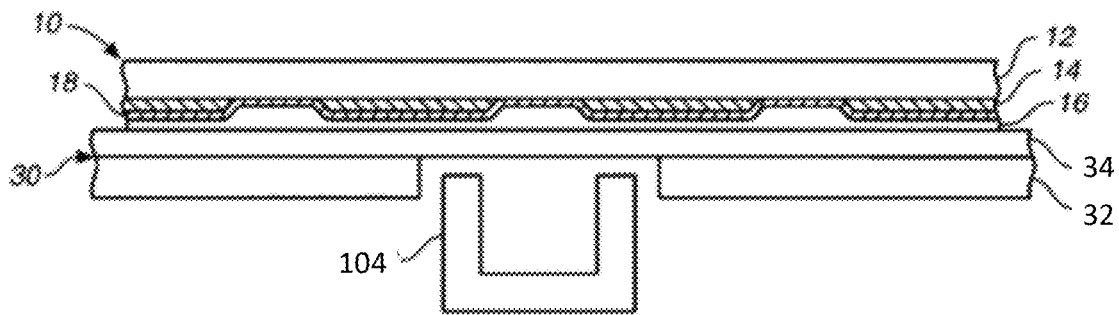
FIGS. 3A-3C are schematic cross-sectional views of a substrate illustrating a polishing process.

Referring to FIG. 3A, the polishing system can be used to polish a substrate 10 that includes a conductive material overlying and/or inlaid in a patterned dielectric layer. For example, the substrate 10 can include a layer of conductive material 16, e.g., a metal, e.g., copper, aluminum, cobalt or titanium, that overlies and fills trenches in a dielectric layer 14, e.g., silicon oxide or a high-k dielectric. Optionally a barrier layer 18, e.g., tantalum or tantalum nitride, can line the trenches and separate the conductive material 16 from the dielectric layer 14. The conductive material 16 in the trenches can provide vias, pads and/or interconnects in a completed integrated circuit. Although the dielectric layer 14 is illustrated as deposited directly on a semiconductor wafer 12, one or more other layers can be interposed between the dielectric layer 14 and the wafer 12.

The semiconductor wafer 12 can be a silicon wafer, e.g., single crystalline silicon, although other semiconductor materials are possible. In addition, the semiconductor wafer 12 can be doped, e.g., with p-type or n-type doping. The doping can be uniform laterally across the wafer, or the wafer can be selectively doped, e.g., as appropriate for fabrication of transistors in integrated circuits using the semiconductor wafer.

Figure 3B:
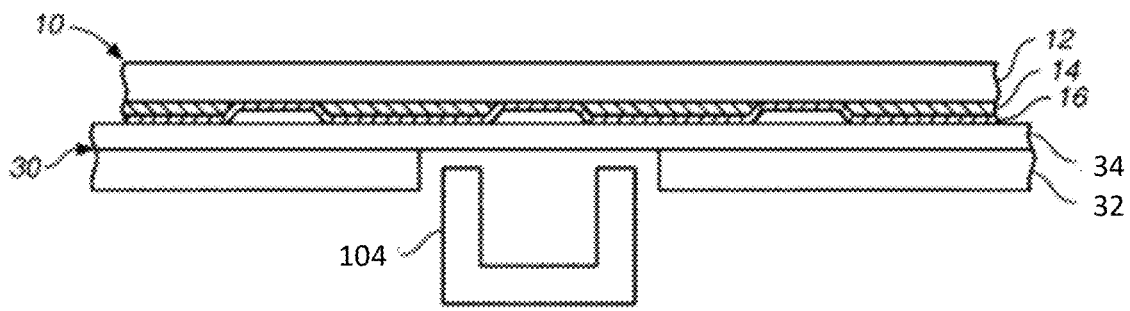
Figure 3C:
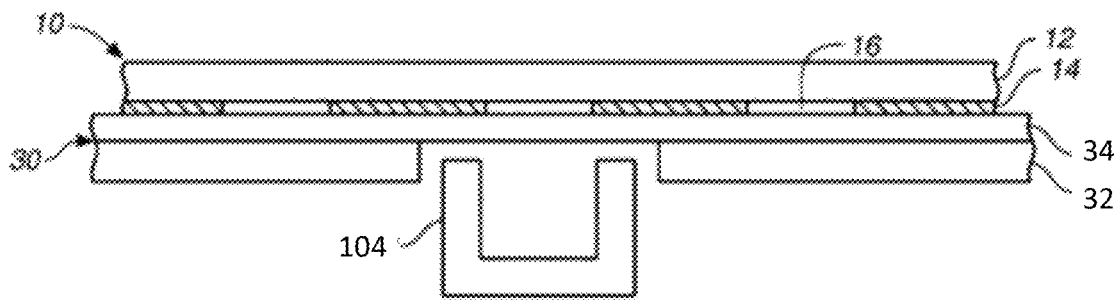

Initially, the conductive material 16 overlies the entire dielectric layer 14. As polishing progresses, the bulk of the conductive material 16 is removed, exposing the barrier layer 18 (see FIG. 3B). Continued polishing then exposes the patterned top surface of the dielectric layer 14 (see FIG. 3C). Additional polishing can then be used to control the depth of the trenches that contain the conductive material 16.

In some implementations, a polishing system includes additional polishing stations. For example, a polishing system can include two or three polishing stations. For example, the polishing system can include a first polishing station with a first electromagnetic induction monitoring system and a second polishing station with a second electromagnetic induction current monitoring system.

For example, in operation, bulk polishing of the conductive layer on the substrate can be performed at the first polishing station, and polishing can be halted when a target thickness of the conductive layer remains on the substrate. The substrate is then transferred to the second polishing station, and the substrate can be polished until an underlying layer, e.g., a patterned dielectric layer.

Returning to FIG. 1, the polishing system includes an in-situ electromagnetic induction monitoring system 100 which can be coupled to or be considered to include a controller 90. A rotary coupler 29 can be used to electrically connect components in the rotatable platen 24, e.g., the sensors of the in-situ monitoring systems, to components outside the platen, e.g., drive and sense circuitry or the controller 90.

The in-situ electromagnetic induction monitoring system 100 is configured to generate a signal that depends on a depth of the conductive material 16, e.g., the metal. The electromagnetic induction monitoring system can operate either by generation of eddy currents in the sheet of conductive material that overlies the dielectric layer, or generation of current in a conductive loop formed in a trench in the dielectric layer on the substrate.

As an eddy current monitoring system, the electromagnetic induction monitoring system 100 can be used to monitor the thickness of a conductive layer by inducing eddy currents in the conductive sheet. Alternatively, as an inductive monitoring system, the electromagnetic induction monitoring system can operate by inductively generating a current in a conductive loop formed in the dielectric layer 14 of the substrate 10 for the purpose of monitoring, e.g., as described in U.S. Patent Publication No. 2015-0371907.

In operation, the polishing system can use the in-situ monitoring system 100 to determine when the conductive layer has reached a target thickness, e.g., a target depth for metal in a trench or a target thickness for a metal layer overlying the dielectric layer, and then halts polishing. Alternatively or in addition, the polishing system can use the in-situ monitoring system 100 to determine differences in thickness of the conductive material 16 across the substrate 10, and use this information to adjust the pressure in one or more chambers 82 in the carrier head 80 during polishing in order to reduce polishing non-uniformity.

A recess 26 can be formed in the platen 24, and optionally a thin section 36 can be formed in the polishing pad 30 overlying the recess 26. The recess 26 and thin section 36 can be positioned such that regardless of the translational position of the carrier head they pass beneath substrate 10 during a portion of the platen rotation. Assuming that the polishing pad 30 is a two-layer pad, the thin section 36 can be constructed by removing a portion of the backing layer 32, and optionally by forming a recess in the bottom of the polishing layer 34. The thin section can optionally be optically transmissive, e.g., if an in-situ optical monitoring system is integrated into the platen 24.

The in-situ monitoring system 100 can include a sensor 102 installed in the recess 26. The sensor 102 can include a magnetic core 104 positioned at least partially in the recess 26, and at least one coil 106 wound around a portion of the core 104. The drive and sense circuitry 108 is electrically connected to the coil 106. The drive and sense circuitry 108 generates a signal that can be sent to the controller 90. Although illustrated as outside the platen 24, some or all of the drive and sense circuitry 108 can be installed in the platen 24.

Figure 4:
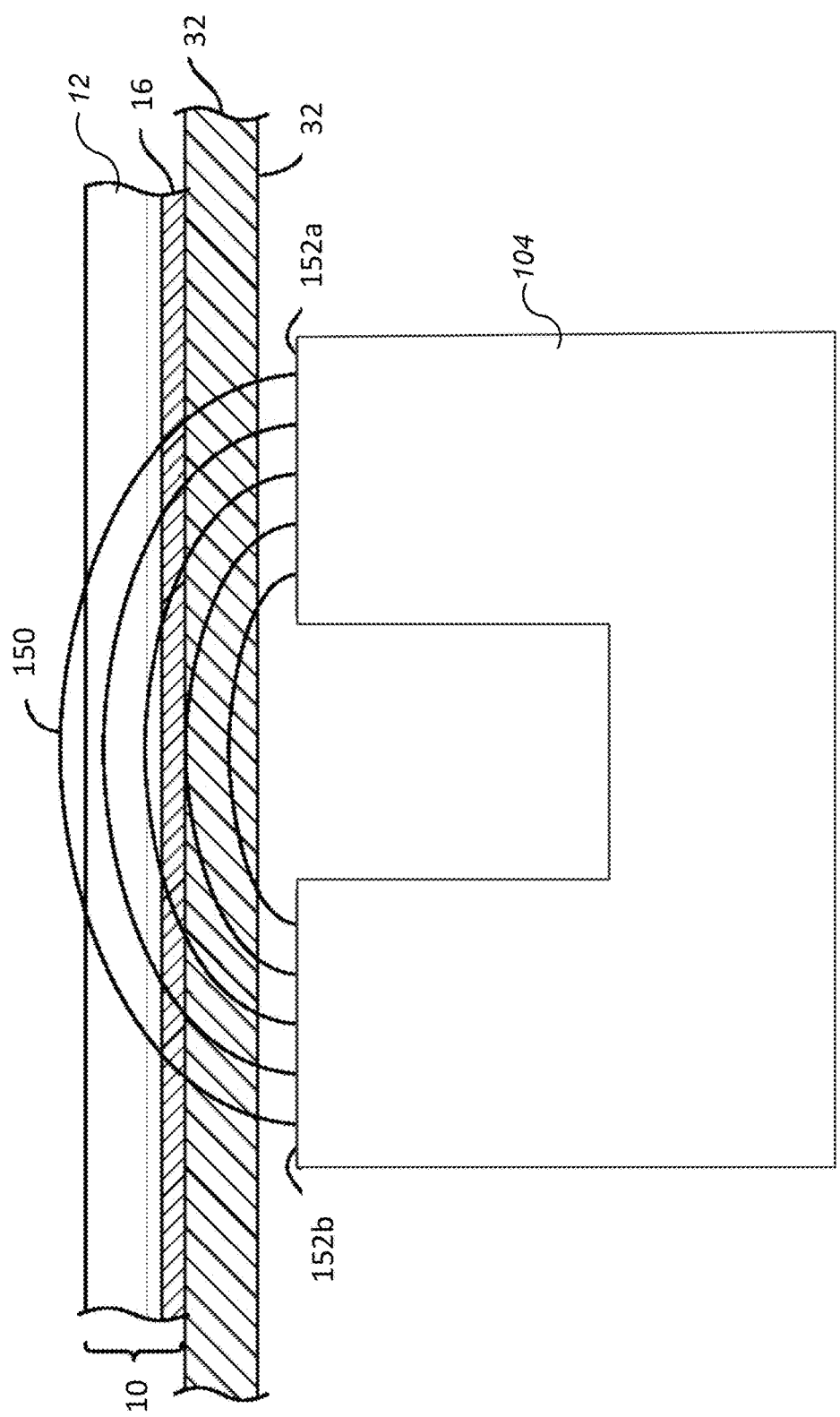
FIG. 4 is a schematic cross-sectional view illustrating an example magnetic field generated by an electromagnetic induction sensor.

Referring to FIGS. 1 and 4, the drive and sense circuitry 108 applies an AC current to the coil 106, which generates a magnetic field 150 between two poles 152*a* and 152*b* of the core 104. Although FIG. 4 illustrates a C-shaped core, other cores are possible, e.g., E-shaped, I-shaped, etc. In operation, when the substrate 10 intermittently overlies the sensor 102, a portion of the magnetic field 150 extends into the substrate 10.

The circuitry 108 can include a capacitor connected in parallel with the coil 106. Together the coil 106 and the capacitor can form an LC resonant tank.

If monitoring of the thickness of a conductive layer on the substrate is desired, then when the magnetic field 150 reaches the conductive layer, the magnetic field 150 can pass through and generate a current (if the target is a loop) or create an eddy-current (if the target is a sheet). This modifies the effective impedance of the LC circuit.

However, the magnetic field 150 can also penetrate into the semiconductor substrate 12. As such, the effective impedance of the LC circuit, and thus the signal from the drive and sense circuitry 108, can also depend on the doping and resultant conductivity of the semiconductor substrate 12.

The drive and sense circuitry 108 can include a marginal oscillator coupled to a combined drive/sense coil 106, and the output signal can be a current required to maintain the peak to peak amplitude of the sinusoidal oscillation at a constant value, e.g., as described in U.S. Pat. No. 7,112,960. Other configurations are possible for the drive and sense circuitry 108. For example, separate drive and sense coils could be wound around the core. The drive and sense circuitry 108 can apply current at a fixed frequency, and the signal from the drive and sense circuitry 108 can be the phase shift of the current in the sense coil relative to the drive coil, or an amplitude of the sensed current, e.g., as described in U.S. Pat. No. 6,975,107.

Referring to FIG. 2, as the platen 24 rotates, the sensor 102 sweeps below the substrate 10. By sampling the signal from the circuitry 108 at a particular frequency, the circuitry 108 generates measurements at a sequence of sampling zones 94 across the substrate 10. For each sweep, measurements at one or more of the sampling zones 94 can be selected or combined. Thus, over multiple sweeps, the selected or combined measurements provide the time-varying sequence of values.

The polishing station 20 can also include a position sensor 96, such as an optical interrupter, to sense when the sensor 102 is underneath the substrate 10 and when the sensor 102 is off the substrate. For example, the position sensor 96 can be mounted at a fixed location opposite the carrier head 70. A flag 98 can be attached to the periphery of the platen 24. The point of attachment and length of the flag 98 is selected so that it can signal the position sensor 96 when the sensor 102 sweeps underneath the substrate 10.

Alternately or in addition, the polishing station 20 can include an encoder to determine the angular position of the platen 24.

Returning to FIG. 1, a controller 90, e.g., a general purpose programmable digital computer, receives the signals from sensor 102 of the in-situ monitoring system 100. Since the sensor 102 sweeps beneath the substrate 10 with each rotation of the platen 24, information on the depth of the conductive layer, e.g., the bulk layer or conductive material in the trenches, is accumulated in-situ (once per platen rotation). The controller 90 can be programmed to sample measurements from the in-situ monitoring system 100 when the substrate 10 generally overlies the sensor 102.

In addition, the controller 90 can be programmed to calculate the radial position of each measurement, and to sort the measurements into radial ranges. By arranging the measurements into radial ranges, the data on the conductive film thickness of each radial range can be fed into a controller (e.g., the controller 90) to adjust the polishing pressure profile applied by a carrier head. The controller 90 can also be programmed to apply endpoint detection logic to the sequence of measurements generated by the in-situ monitoring system 100 signals and detect a polishing endpoint.

Since the sensor 102 sweeps underneath the substrate 10 with each rotation of the platen 24, information on the conductive layer thickness is being accumulated in-situ and on a continuous real-time basis. During polishing, the measurements from the sensor 102 can be displayed on an output device to permit an operator of the polishing station to visually monitor the progress of the polishing operation.

Figure 5:
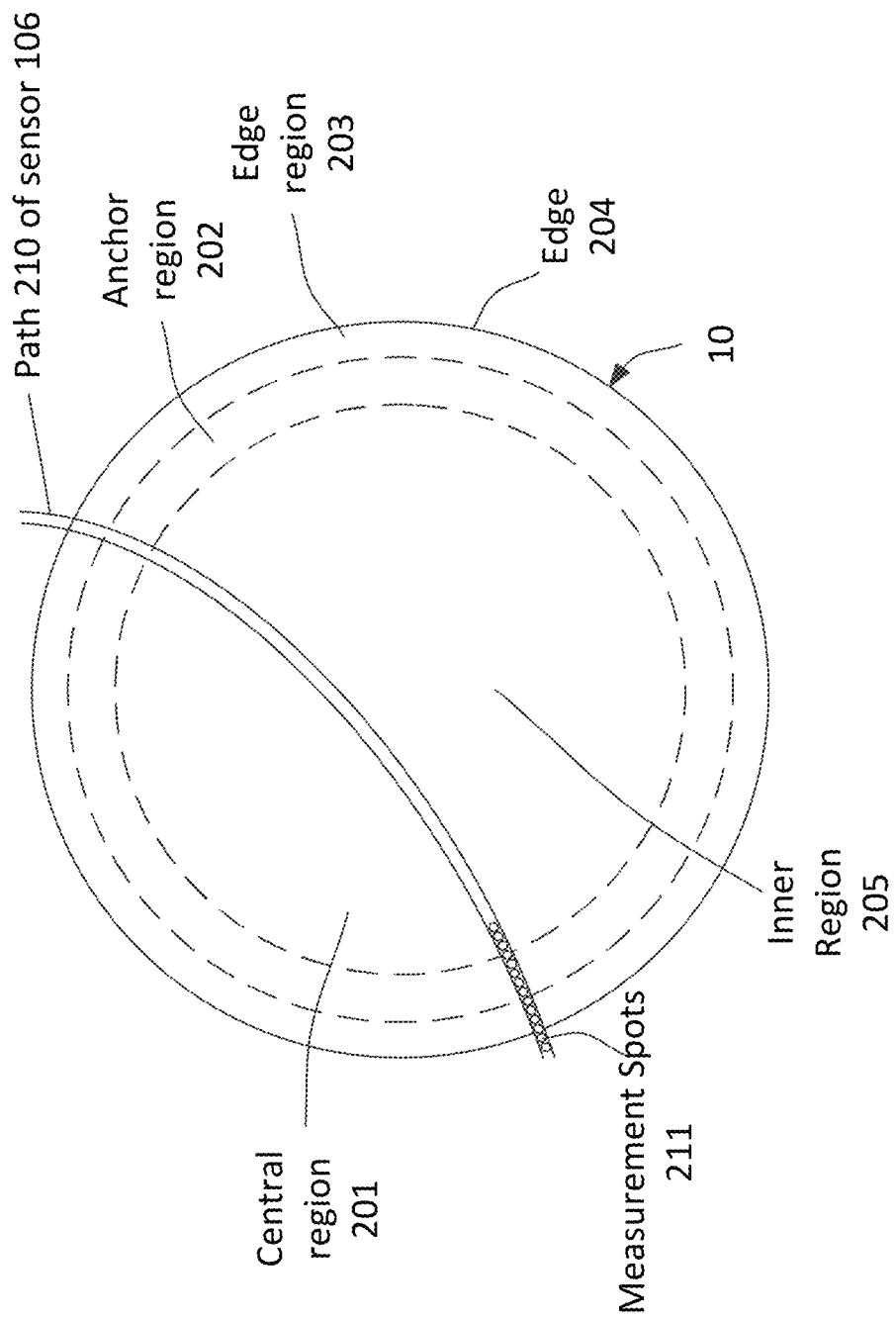
FIG. 5 is a schematic top view of a substrate being scanned by a sensor head of a polishing apparatus.

Referring to FIGS. 2 and 5, changes in the position of the sensor head with respect to the substrate 10 can result in a change in the signal from the in-situ monitoring system 100. That is, as the sensor head scans across the substrate 10, the in-situ monitoring system 100 will make measurements for multiple regions 94, e.g., measurement spots 211, at different locations on the substrate 10. The regions 94 can be partially overlapping.

Figure 6:
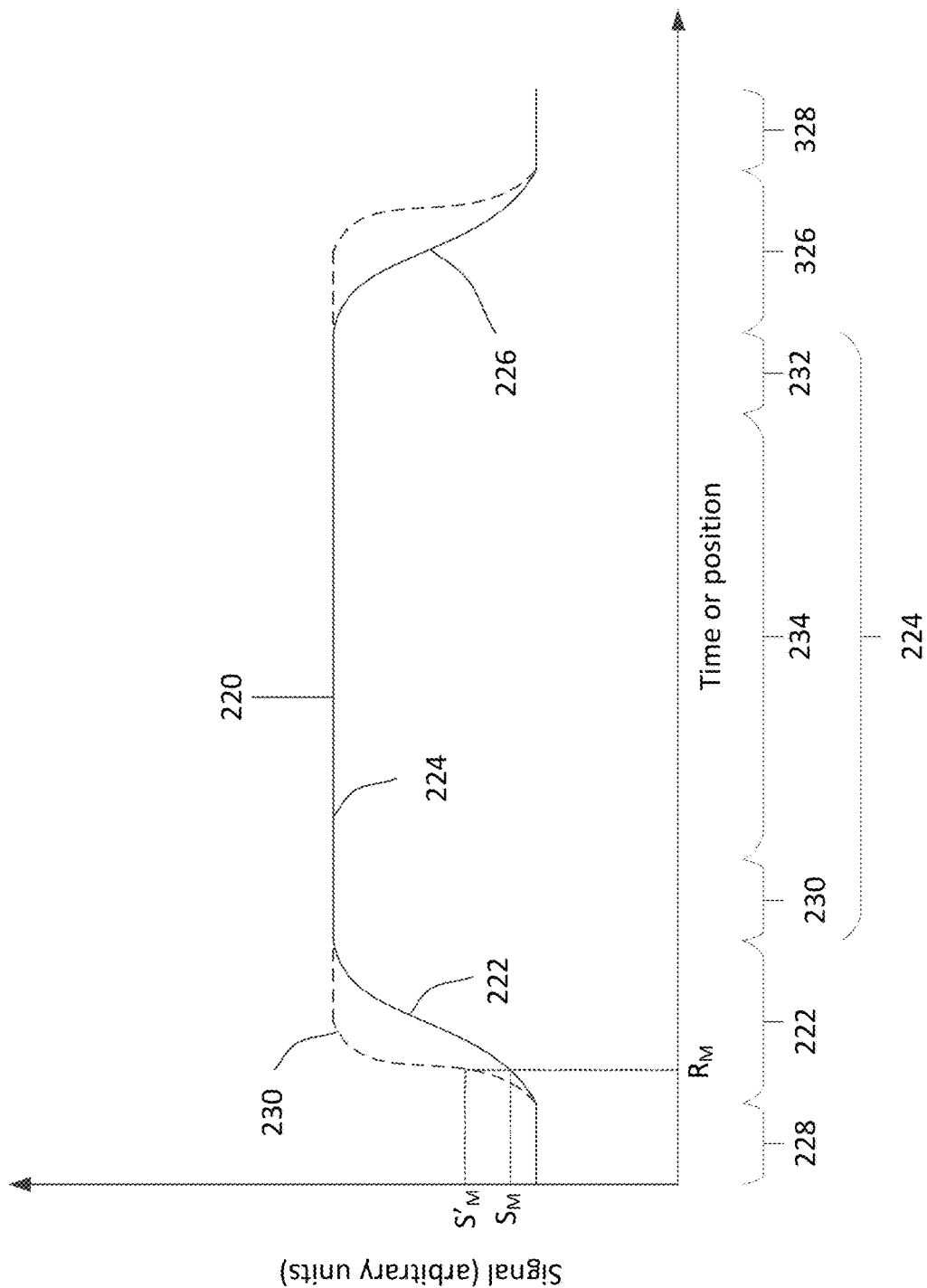
FIG. 6 is a schematic graph of measured signals obtained while monitoring locations on a substrate.

FIG. 6 illustrates a graph that shows a signal 220 from the in-situ monitoring system 100 during a single pass of the sensor 102 below the substrate 10. This signal 220 can be termed a "trace" across the substrate. The signal 220 is composed of a series of individual measurements from the sensor head as it sweeps below the substrate. The graph can be a function of measurement time or of position, e.g., radial position, of the measurement on the substrate. In either case, different portions of the signal 220 correspond to measurement spots 211 at different locations on the substrate 10 scanned by the sensor 102. Thus, the graph depicts, for a given location of the substrate scanned by the sensor head, a corresponding measured signal value from the signal 220.

Referring to FIGS. 5 and 6, the signal 220 includes a first portion 222 that corresponds to locations in an edge region 203 of the substrate 10 when the sensor 102 crosses a leading edge of the substrate 10, a second portion 224 that corresponds to locations in a central region 201 of the substrate 10, and a third portion 226 that corresponds to locations in edge region 203 when the sensor 102 crosses a trailing edge of the substrate 10. The signal can also include portions 228 that correspond to off-substrate measurements, i.e., signals generated when the sensor head scans areas beyond the edge 204 of the substrate 10 in FIG. 5.

The edge region 203 can correspond to a portion of the substrate where measurement spots 211 of the sensor head overlap the substrate edge 204. The central region 201 can include an annular anchor region 202 that is adjacent the edge region 203, and an inner region 205 that is surrounded by the anchor region 202. The sensor head may scan these regions on its path 210 and generate a sequence of measurements that correspond to a sequence of locations along the path 210.

In the first portion 222, the signal intensity ramps up from an initial intensity (typically the signal resulting when no substrate and no carrier head is present) to a higher intensity. This is caused by the transition of the monitoring location from initially only slightly overlapping the substrate at the edge 204 of the substrate (generating the initial lower values) to the monitoring location nearly entirely overlapping the substrate (generating the higher values). Similarly, in the third portion 226, the signal intensity ramps down when the monitoring location transitions to the edge 204 of the substrate.

Although the second portion 224 is illustrated as flat, this is for simplicity, and a real signal in the second portion 224 would likely include fluctuations due both to noise and to variations in the layer thickness. The second portion 234 corresponds to the monitoring location scanning the central region 201. The second portion 224 includes two sub-portions 230 and 232 that are caused by the monitoring location scanning the anchor region 202 of the central region 201, and sub-portion 234 that is caused by the monitoring location scanning the inner region 205 of the central region 201.

As noted above, the variation in the signal intensity in the regions 222, 226 is caused in part by measurement region of the sensor 106 overlapping the substrate edge, rather than an intrinsic variation in the thickness or conductivity of the layer being monitored. Consequently, this distortion in the signal 220 can cause errors in the calculating of a characterizing value for the substrate, e.g., the thickness of the layer, near the substrate edge. To address this problem, the controller 90 can include a neural network, e.g., neural network 300 of FIG. 7, to generate a modified signal corresponding to one or more locations of the substrate 10 based on the measured signals corresponding to those locations.

Figure 7:
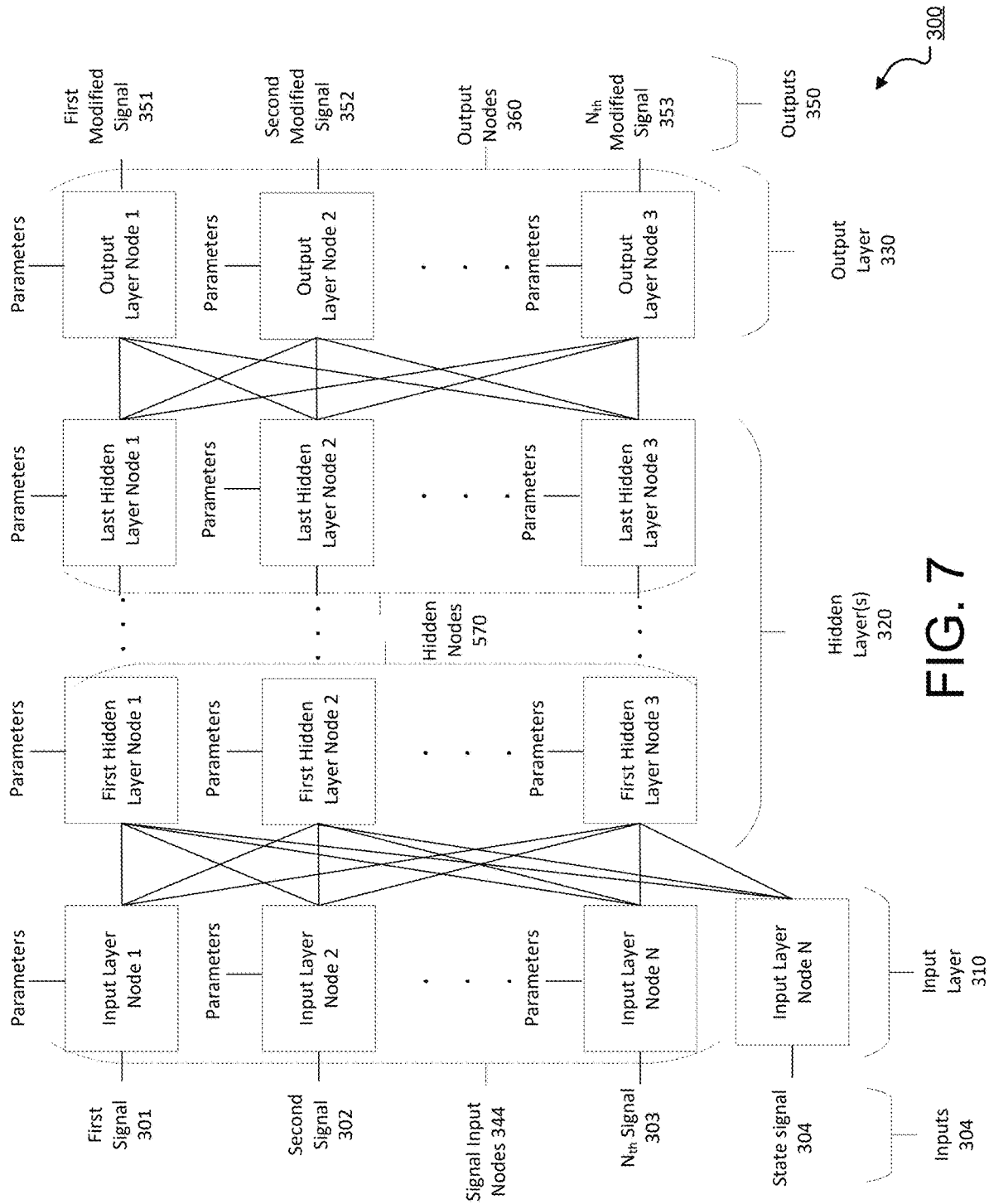
FIG. 7 is an example neural network.

Referring now to FIG. 7, the neural network 300 is configured to, when trained appropriately, generate modified signals that reduce and/or remove the distortion of computed signal values near the substrate edge. The neural network 300 receives a group of inputs 304 and processes the inputs 304 through one or more neural network layers to generate a group of outputs 350. The layers of the neural network 300 include an input layer 310, an output layer 330, and one or more hidden layers 320.

Each layer of the neural network 300 includes one or more neural network nodes. Each neural network node in a neural network layer receives one or more node input values (from the inputs 304 to the neural network 300 or from the output of one or more nodes of a preceding neural network layer), processes the node input values in accordance with one or more parameter values to generate an activation value, and optionally applies a non-linear transformation function (e.g., a sigmoid or tan h function) to the activation value to generate an output for the neural network node.

Each node in the input layer 310 receives as a node input value one of the inputs 304 to the neural network 300.

The inputs 304 to the neural network include measured signal values from the in-situ monitoring system 100 for multiple different spots 211 on the substrate 10, such as a first measured signal value 301, a second measured signal value 302, through an nth measured signal value 303. The measured signal values can be individual values of the sequence of values in the signal 220.

In general, the multiple different locations include locations in the edge region 203 and, optionally, the anchor region 202 of the substrate 10. In some implementations, the multiple different locations are only in the edge region 203 and the anchor region 202. In other implementations, the multiple different locations span all regions of the substrate.

These measured signal values are received at signal input nodes 344. Optionally, the input nodes 304 of the neural network 300 can also include one or more state input nodes 316 that receive one or more process state signals 304, e.g., a measure of wear of the pad 30 of the polishing apparatus 20.

The nodes of the hidden layers 320 and output layer 330 are illustrated as receiving inputs from every node of a preceding layer. This is the case in a fully-connected, feedforward neural network. However, the neural network 300 may be a non-fully-connected feedforward neural network or a non-feedforward neural network. Moreover, the neural network 300 may include at least one of one or more fully-connected, feedforward layers; one or more non-fully-connected feedforward layers; and one or more non-feedforward layers.

The neural network generates a group of modified signal values 350 at the nodes of the output layer 330, i.e., "output nodes" 350. In some implementations, there is an output node 350 for each measured signal from the in-situ monitoring system that is fed to the neural network 300. In this case, the number of output nodes 350 can correspond to the number of signal input nodes 304 of the input layer 310.

For example, the number of signal input nodes 344 can equal the number of measurements in the edge region 203 and the anchor region 202, and there can be an equal number of output nodes 350. Thus, each output node 350 generates a modified signal that corresponds to a respective measured signal supplied as an input to a signal input node 344, e.g., the first modified signal 351 for the first measured signal 301, the second modified signal 352 for the second measured signal 302, and the nth modified signal 353 for the nth measured signal 303.

In some implementations, the number of output nodes 350 is smaller than the number of input nodes 304. In some implementations, the number of output nodes 350 is smaller than the number of signal input nodes 344. For example, the number of signal input nodes 344 can equal the number of measurements in the edge region 203, or equal to the number of measurements in the edge region 203 and anchor region 202. Again, each output node 350 of the output layer 330 generates a modified signal that corresponds to a respective measured signal supplied as a signal input node 304, e.g., the first modified signal 351 for the first measured signal 301, but only for the signal input nodes 354 that receive signals from the edge region 203.

The polishing apparatus 100 can use the neural network 300 to generate modified signals. The modified signals can then be used to determine a thickness for each location in a first group of locations of a substrate, e.g., the locations in the edge region (and possibly the anchor region). For example, referring back to FIG. 6, the modified signal values for the edge region can provide a modified portion 230 of the signal 220.

In some implementations, for a modified signal value that corresponds to a given measurement location, the neural network 500 can be configured such that only input signal values from measurement locations within a predetermined distance of that given location are used in determining the modified signal value.

To train the neural network, the sensor 102 of the in-situ monitoring system 100 can be used to generate a profiles of reference substrates. In addition, ground truth measures of thickness of the reference substrates can be obtained; these measurements can be performed for locations that are to be processed by the neural network. The system can generate the ground truth measures of thickness using an electrical impedance measuring method, such as a four-points probe method. The signal values from the reference substrate are applied to the inputs 304 while the ground truth measurements are applied to the outputs 350 and the system is run in a training mode, e.g., gradient descent with backpropagation.

The reference substrates can include blank undoped wafers on which a uniform thickness of a conductive material is deposited. The amount of conductive material can be selected to simulate the presence of a doped wafer.

The reference substrates can also include sample device substrates at an equivalent stage of processing as the device substrate for which the in-situ monitoring system is to be used for controlling of polishing, e.g., substrates with layers having different edge profiles.

As noted above, the signal generated by the in-situ monitoring system also includes the contribution from the doped wafer. If not handled properly, attempts to compensate for the contribution to the signal from the doped wafer can introduce additional errors, e.g., at the substrate edge when edge reconstruction techniques are utilized.

Figure 8:
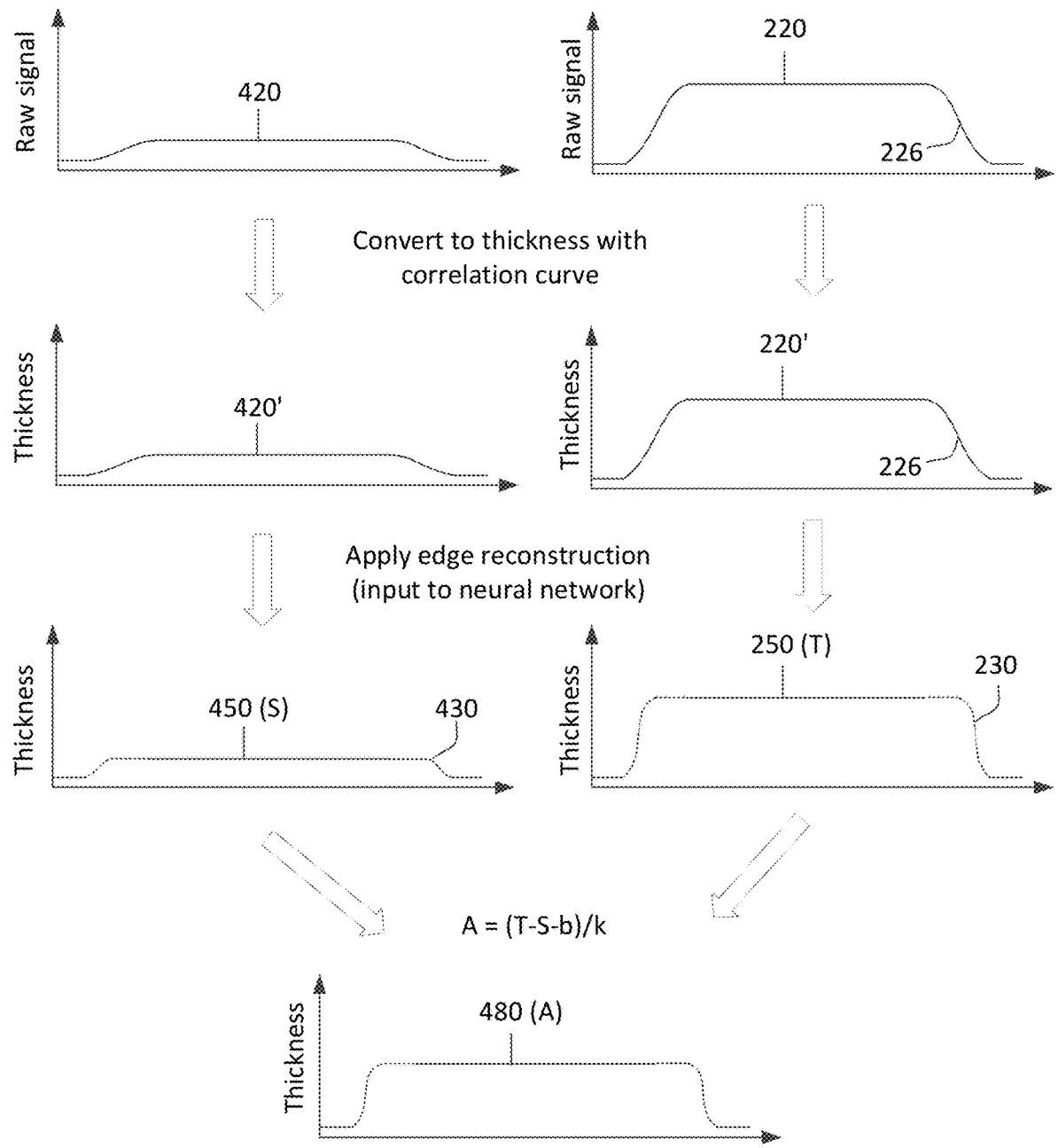
FIG. 8 is a schematic illustration of the process of compensating for substrate doping while also applying edge reconstruction.

Referring to FIG. 8, a reference trace 420 across a blank doped wafer is generated. This reference trace 420 is generated prior to polishing of the substrate. The blank doped wafer has the same doping profile as the wafers to be used in the device substrate to be polished. In some implementations, the reference trace is generated by scanning a sample blank doped wafer, e.g., a sacrificial wafer, with the sensor 102 of the in-situ monitoring system 100. For example, the reference trace could be generated by fab operator. Alternatively, the system manufacturer could generate reference traces for wafers having a variety of different dopings (e.g., concentrations and/or doping materials), and these traces can be stored in a library. The operator can then select one of the references traces from the library, e.g., from a drop-down menu or similar user interface, that corresponds most closely to the doping of the wafer in the device substrates to be polished.

The raw signal values in the reference trace 420 from the sensor 102 can be converted to thickness values (represented by reference trace 420') using a correlation curve.

Figure 9:
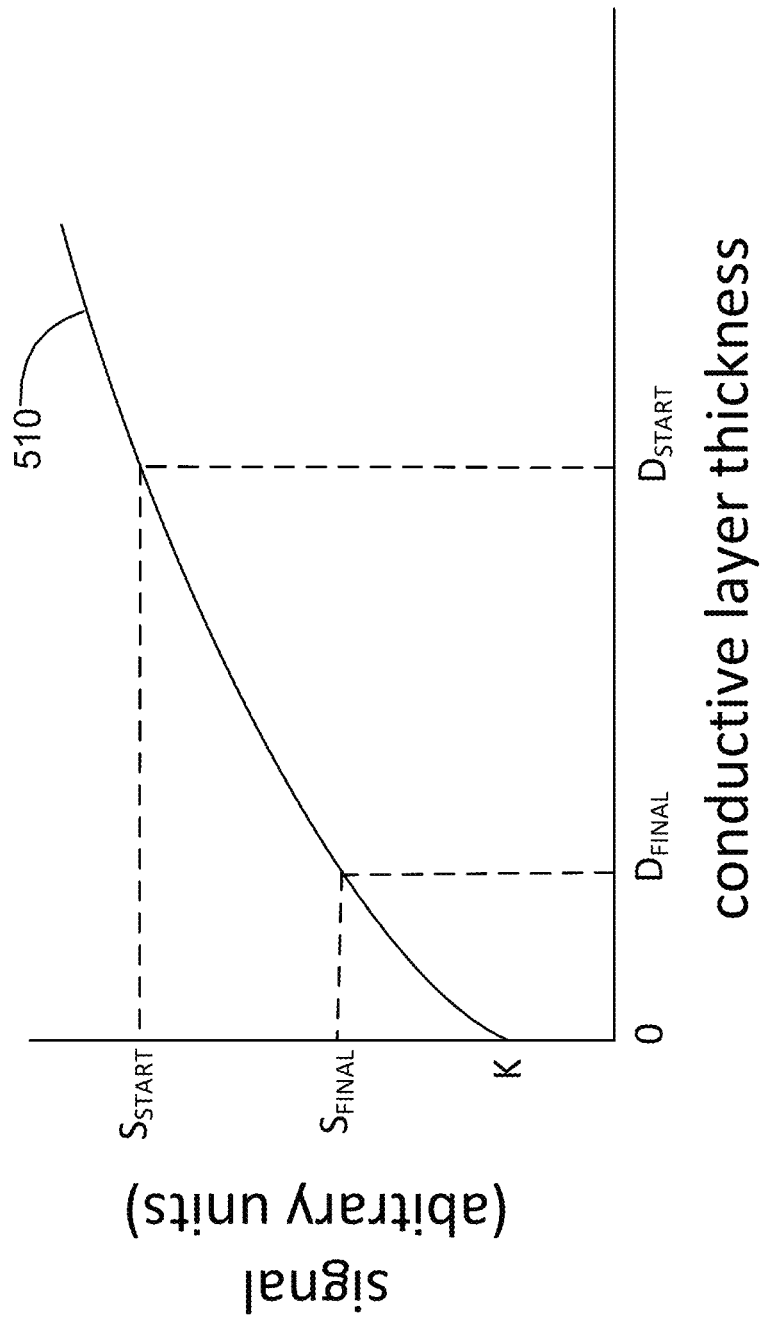
FIG. 9 illustrates a graph of an example eddy current phase signal as a function of conductive layer thickness.

FIG. 9 shows a correlation curve 510, for a given resistivity, between the thickness of a conductive layer of the given resistivity and the signal from the electromagnetic induction monitoring system 100. $D_{START}$ represents the initial thickness of the conductive layer, $S_{START}$ is the desired signal value corresponding to the initial thickness $D_{START}$; $D_{FINAL}$ represents the final thickness of the conductive layer, and $S_{FINAL}$ is the desired signal value correspond to the final thickness; and K is a constant representing a value of the signal for zero conductive layer thickness.

The relationship curve 510 can be represented in the controller 90 by a function, e.g., a polynomial function, e.g., a second order function, a third order function, or a higher order function. The correlation between the signal X(x) and the thickness D(x) can be represented by the equation:

$$X(x)=W_1 \cdot D(x)^2+W_2 \cdot D(x)+W_3 \qquad \text{(Equation 1)}$$

where $W_1$, $W_2$, and $W_3$ are real number coefficients. Thus, the controller can store the values of the coefficients of the function, e.g., $W_1$, $W_2$, and $W_3$, as well as the resistivity $\rho_0$ for which the relationship curve 510 applies. In addition, the relationship could be represented with a linear function, a Bezier curve, or a non-polynomial function, e.g., exponential or logarithmic.

The relationship curve 510 can be used to convert the signal values in the raw signal 420 from the reference wafer to "equivalent" thickness measurements. That is, although there is no conductive layer on top of the doped reference wafer, the measurement can be represented as a thickness values. These are "equivalent" thickness values because each is a thickness of an equivalent conductive layer on an undoped wafer that would generate the same signal as the doped reference wafer.

Returning to FIG. 8, the reference trace 420' is then processed by the neural network as if it were a normal signal to perform the edge reconstruction algorithm on the reference trace. This generates a modified reference trace 450 with a portion having modified signal values 430.

In some implementations, the conversion to thickness is performed in advance, and what is stored in the library (and selected by the operator) is the reference trace 420' with thickness values. In some implementations, the thickness conversion and edge reconstruction are performed in advance, and what is stored in the library (and selected by the operator) is a modified reference trace 450.

During the polishing operation, the substrate 10 is monitored by the in-situ monitoring system, and the measured trace 220 for the substrate 10 is generated for each sweep of the sensor 102 across the substrate 10. This measured trace 220 can also be termed a "total" trace or signal, as it includes contributions from both the conductive layer being polished and the underlying doped wafer.

The relationship curve 510 (see FIG. 9) can be used to convert the signal values in the signal 220 from the substrate being polished to thickness measurements (represented by measured trace 220').

Each measured trace 220' is processed by the neural network, as discussed above, to generate a modified measured trace 250 with a portion having modified values 230.

In some implementations, the conversion from raw signal to thickness can be performed for both the reference wafer and the substrate being polished after the edge reconstruction is performed.

To compensate for the wafer doping, the controller 190 can generate an adjusted trace 480. Generating the adjusted trace includes subtracting the modified reference trace 450 from the modified measured trace 250. Assuming the modified reference trace 450 is represented by S(x), and the modified measured trace 250 is represented by T(x), with x being a radial position, then T(s)−S(x) provides an apparent thickness trace.

For some configurations of the sensor 102, the contribution from the doped wafer and the substrate to the trace are not a simple superposition. Rather, the apparent thickness of the conductive layer can be somewhat smaller than the actual thickness. This problem can become more pronounced at higher driving frequencies.

Figure 10:
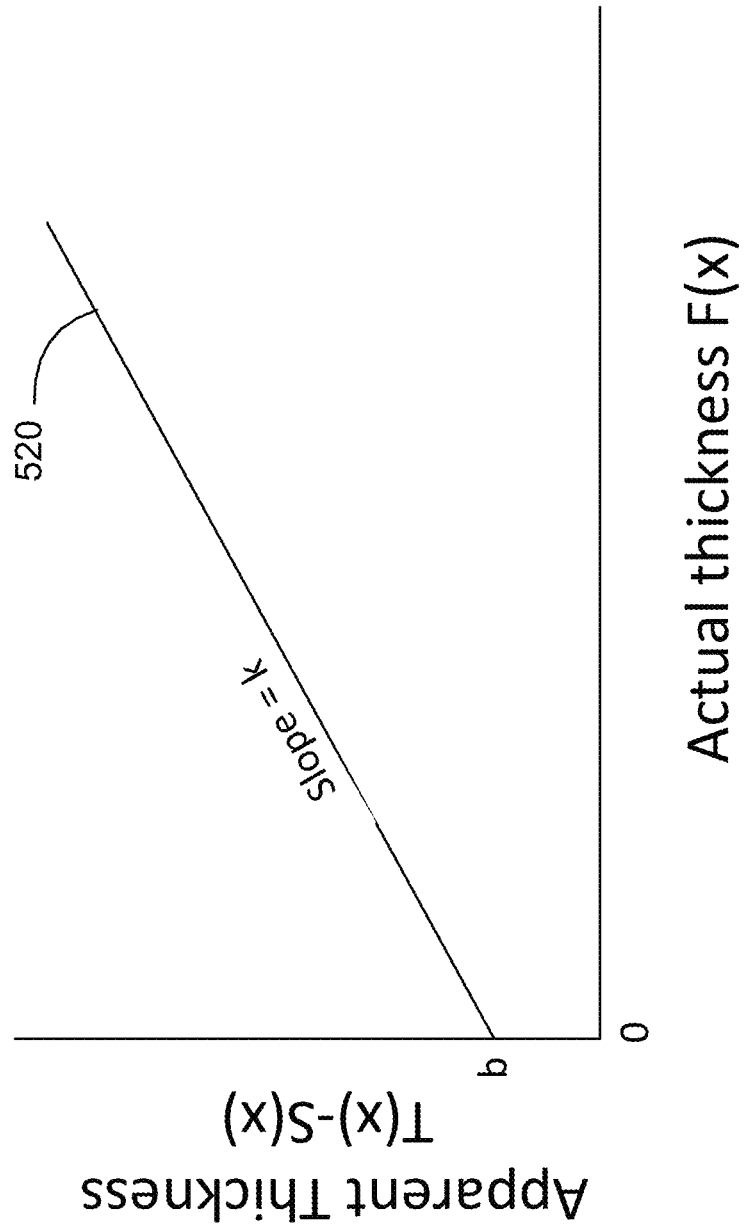
FIG. 10 is a schematic illustration of generation of an adjusted trace for a substrate being polished.

However, any particular sensor configuration (e.g., driving frequency, shape and dimensions of core, location and number of winding s of coil, etc.) does appear to have a generally linear relationship between the actual thickness and the apparent thickness. This relationship is illustrated in FIG. 10. A function 520 that relates the apparent thickness to the actual thickness can be expressed as a linear function with a slope of k and a y-intercept (where the thickness should be zero) of b. These values k and b can be determined empirically by testing, and will vary between different sensor configurations. The value of k tends to be less than or equal to 1, e.g., a value from 0.7 to 1.

Thus, an adjusted film thickness profile, A(x), of the conductive layer on the substrate can be calculated according to A(x)=(T(x)–S(x)–b)/k.

Endpoint can be called when the adjusted thickness value A(x) reaches a target thickness value $D_{TARGET}$. Similarly, the adjusted thickness values A'(x) can be used for control of the polishing parameters, e.g., for calculation of polishing pressures to reduce non-uniformity.

In some cases, the relationship between the apparent thickness and the actual thickness for a particular sensor configuration may not be linear. In such a case, a more complex equation, e.g., a polynomial, may be used to calculate the actual thickness.

In some implementations, the raw signal is normalized before conversion to thickness values. This technique is applicable to both the reference trace 420 and the substrate trace 220. For example, a calibrated signal X'(x) can be generated according to $$X'(x)=G*X(x)-\Delta K \quad \text{(Equation 2)}$$

where G is a gain and ΔK is an offset, but determined experimentally for the in-situ monitoring system using a blank wafer having a conductive layer of known thickness and conductivity. X(x) represents the raw signal values, e.g., from either the reference trace 420 or the substrate trace 220, as appropriate for processing of the respective traces. The calibrated signal X'(x) is then used for the correlation curve, e.g., in place of X(x) in Equation 1 above, to determine the thickness values.

In addition, during conversion of the raw signal values to thickness values, the resistivity of the layer can be taken into account. For example, the thickness value calculated using the correlation curve, e.g., Equation 1 above, can be adjusted based on the resistivity of the layer to provide a corrected thickness value. This technique can be used for both the reference trace 420 and the substrate trace 220.

The corrected thickness values D'(x) can be calculated as follows:

$$D'(x)=D(x)*(\rho_X/\rho_0) \quad \text{(Equation 3)}$$

where $\rho_X$ is the resistivity of the conductive layer, and $\rho_0$ is the resistivity for which the relationship curve 410 (and the values $W_1$, $W_2$, $W_3$) applies, and where D(x) represents the initial thickness values calculated using the correlation curve (from either the reference trace 420 or the substrate trace 220, as appropriate). The edge reconstruction algorithm can be applied to the corrected thickness values D'(x) instead of initial thickness values D(x).

In addition to the substrate-to-substrate variations in resistivity, changes in temperature of the layer can result in a change in the resistance of the conductive layer. For example, the conductive layer may become hotter as polishing progresses, and thus more conductive (lower resistivity). In particular, the controller carrying out the process can also calculate a resistivity $\rho_T$ of the conductive layer at the real time temperature T(t). The real time temperature T(t) can be determined from the temperature sensor 64. In some implementations, the adjusted resistivity $\rho_T$ is calculated based on the following equation:

$$\rho_T=\rho_X[1+\alpha(T(t)-T_{ini})] \quad \text{(Equation 4)}$$

where $T_{ini}$ is the initial temperature of the conductive layer when the polishing process starts. The adjusted resistivity $\rho_T$ is then used in place of the resistivity $\rho_X$, e.g., in Equation 3 above (or in calculation of the gain and offset in Equation 2).

In situations where the polishing process is carried out under room temperature, $T_{ini}$ can take the approximate value of 20° C. $\rho_X$ is the resistivity of the conductive layer at $T_{ini}$, which can be room temperature. Typically, α is a known value that can be found in literature or can be obtained from experiment. Although the raw signal 220 includes a contribution from the underlying doped wafer, the value α of the conductive layer can be used as a first approximation in calculation of the thickness values for the trace 220'.

In some implementations, the temperatures T and $T_{ini}$ used in adjusting the measured eddy current signal are the temperature of the conductive layer, e.g., as measured by a temperature sensor in the carrier head. In some implementations, the temperatures T and $T_{ini}$ can be the temperatures of the polishing pad or the temperatures of the slurry instead of the temperatures of the conductive layer.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used to refer to relative positioning within the system or substrate; it should be understood that the polishing surface and substrate can be held in a vertical orientation or some other orientation during the polishing operation.

Functional operations of the controller 90 can be implemented in digital electronic circuitry, or in computer software, firmware, or hardware, and structural equivalents thereof, or in combinations of them. The computer software can be implemented as one or more computer program products, i.e., one or more computer programs tangibly embodied in a non-transitory computer readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

A number of embodiments of the invention have been described. Nevertheless, it will be understood that various modifications may be made without departing from the spirit and scope of the invention. For example, although the description above has focused on chemical mechanical polishing, the control system can be adapted to other semiconductor processing techniques, e.g., etching or deposition, e.g., chemical vapor deposition. In addition, the technique can be applied to an in-line or stand-alone metrology system rather than in-situ monitoring. Accordingly, other embodiments are within the scope of the following claims.

What is claimed is:

1. A method of polishing a substrate, comprising:
storing or generating a modified reference trace representing a sequence of measurements taken by a sensor, of an in-situ electromagnetic induction monitoring system, moving across a bare, n-type or p-type doped reference semiconductor wafer as modified by a neural network, wherein the neural network is configured to compensate for distortions caused by a partial overlap between an edge of a semiconductor wafer and a magnetic field generated by the in-situ electromagnetic induction monitoring system, wherein the neural network comprises an input layer, an output layer, and one or more hidden layers;
bringing a substrate comprising a conductive layer disposed over the semiconductor wafer into contact with a polishing pad;
generating relative motion between the substrate and the polishing pad;
monitoring the substrate with the in-situ electromagnetic induction monitoring system as the conductive layer is polished to generate a measured trace including measured signal values at multiple different locations on the semiconductor wafer, wherein the measured signal values depend that depends on a thickness of the conductive layer, wherein the measured trace is a sequence of measurements as the sensor moves across the substrate;
applying at least a portion of the measured trace including the measured signal values at multiple different locations on the semiconductor wafer as input to the neural network configured to compensate for the distortions caused by the partial overlap between the edge of the semiconductor wafer and the magnetic field generated by the in-situ electromagnetic induction monitoring system to generate a modified measured trace;
generating an adjusted trace to at least partially compensate for a contribution of conductivity of the semiconductor wafer to the measured trace, including subtracting the modified reference trace from the modified measured trace; and
at least one of halting polishing or modifying a polishing parameter based on the adjusted trace.

2. The method of claim 1, comprising scanning the bare, doped reference semiconductor wafer with the sensor of the in-situ electromagnetic induction monitoring system to generate a preliminary reference trace having raw signal values, converting raw signal values in the preliminary reference trace to thickness values to generate an initial reference trace, and applying at least a portion of the initial reference trace to the neural network to generate the modified reference trace.

3. The method of claim 1, wherein generating the modified reference trace includes scanning across the bare, doped reference semiconductor wafer with the sensor of the in-situ electromagnetic induction monitoring system.

4. The method of claim 1, wherein generating the adjusted trace comprises scaling a difference between the modified reference trace and the modified measured trace,
wherein the difference is calculated by subtraction of the modified reference trace from the modified measured trace.

5. The method of claim 4, wherein the adjusted trace $A(x)$ is calculated such that $$A(x)=(T(x)-S(x)-b)/k$$

where $T(x)$ is the modified measured trace, $S(x)$ is the modified reference trace, and b and k are constants.

6. The method of claim 5, comprising selecting b and k according to a configuration of the sensor of the in-situ electromagnetic induction monitoring system.

7. The method of claim 1, wherein at least the portion of the measured trace applied to the neural network includes a portion corresponding to an edge region of the substrate.

8. The method of claim 7, wherein at least the portion of the measured trace applied to the neural network does not include a portion corresponding to a central region of the substrate.

9. The method of claim 1, comprising training the neural network with a plurality of training traces representing measurements of one or more training substrates comprising a conductive layer on an undoped semiconductor wafer,
wherein the one or more training substrates with different training traces have different thicknesses of the conductive layer and different edge profiles.

10. The method of claim 1, comprising receiving user input selecting the modified reference trace from a plurality of modified reference traces.

11. The method of claim 1, wherein each layer of the neural network comprises one or more neural network nodes, and wherein
each neural network node of the one or more neural network nodes receives one or more node input values from one of the inputs to the neural network or from an output of one or more nodes of a preceding neural network layer.

12. The method of claim 11, wherein the neural network comprises at least one of (A) a fully-connected, feedforward layer, (B) a non-fully-connected feedforward layer, and (C) a non-feedforward layer.

13. The method of claim 11, wherein a number of neural network nodes of the output layer is smaller than a number of neural network nodes of the input layer.

14. The method of claim 11, wherein a number of neural network nodes of the input layer is equal to a number of the measured signal values at the multiple different locations on the semiconductor wafer.

15. A computer program product, tangibly embodied in a non-transitory computer readable medium, comprising instructions to cause one or more computers to:
store or generate a modified reference trace representing a sequence of measurements taken by a sensor, of an in-situ electromagnetic induction monitoring system, moving across a bare, n-type or p-type doped reference semiconductor wafer as modified by a neural network, wherein the neural network is configured to compensate for distortions caused by a partial overlap between an edge of a semiconductor wafer and a magnetic field generated by the in-situ electromagnetic induction monitoring system, wherein the neural network comprises an input layer, an output layer, and one or more hidden layers;

receive from the in-situ electromagnetic induction monitoring system, as a conductive layer disposed over the semiconductor wafer of a substrate is polished, a measured trace including measured signal values at multiple different locations on the semiconductor wafer, wherein the measured signal values depend on a thickness of the conductive layer, wherein the measured trace is a sequence of measurements as the sensor moves across the substrate;

process at least a portion of the measured trace including the measured signal values at multiple different locations on the semiconductor wafer as input through the neural network configured to compensate for the distortions caused by the partial overlap between the edge of the semiconductor wafer and the magnetic field generated by the in-situ electromagnetic induction monitoring system to generate a modified measured trace;

generate an adjusted trace to at least partially compensate for a contribution of conductivity of the semiconductor wafer to the measured trace, wherein the instructions to generate the adjusting trace include subtracting the modified reference trace from the modified measured trace; and at least one of halt polishing or modify a polishing parameter based on the adjusted trace.

16. The computer program product of claim 15, wherein the instructions to generate the adjusted trace comprise scaling a difference between the modified reference trace and the modified measured trace, wherein the difference is calculated by subtraction of the modified reference trace from the modified measured trace.

17. The computer program product of claim 16, wherein the adjusted trace A(x) is calculated such that $$A(x)=(T(x)-S(x)-b)/k$$

where T(x) is the modified measured trace, S(x) is the modified reference trace, and b and k are constants.

18. The computer program product of claim 15, wherein at least the portion of the measured trace applied to the neural network includes a portion corresponding to an edge region of the substrate.

19. The computer program product of claim 18, wherein at least the portion of the measured trace applied to the neural network does not include a portion corresponding to a central region of the substrate.

20. The computer program product of claim 15, comprising instructions to receive user input selecting the modified reference trace from a plurality of modified reference traces.

21. A polishing system, comprising:
a support to hold a polishing pad;
a carrier head to hold a substrate in contact with the polishing pad;
an in-situ electromagnetic induction monitoring system to monitor the substrate as a conductive layer on the substrate is polished to generate a measured trace including measured signal values at multiple different locations on a semiconductor wafer, wherein the measured signal values depend on a thickness of the conductive layer; and
a controller configured to
store or generate a modified reference trace representing a sequence of measurements taken by a sensor, of the in-situ electromagnetic induction monitoring system, moving across a bare, n-type or p-type doped reference semiconductor wafer as modified by a neural network, wherein the neural network is configured to compensate for distortions caused by a partial overlap between an edge of the semiconductor wafer and a magnetic field generated by the in-situ electromagnetic induction monitoring system, wherein the neural network comprises an input layer, an output layer, and one or more hidden layers,
receive the measured trace from the in-situ electromagnetic induction monitoring system, wherein the measured trace is a sequence of measurements as the sensor moves across the substrate,
process at least a portion of the measured trace including the measured signal values at multiple different locations on the semiconductor wafer as input through the neural network configured to compensate for the distortions caused by the partial overlap between the edge of the semiconductor wafer and the magnetic field generated by the in-situ electromagnetic induction monitoring system to generate a modified measured trace,
generate an adjusted trace to at least partially compensate for a contribution of conductivity of the semiconductor wafer to the measured trace, including subtracting the modified reference trace from the modified measured trace, and
at least one of halt polishing or modify a polishing parameter based on the adjusted trace.

22. The polishing system of claim 21, wherein the controller is configured to generate the adjusted trace by scaling a difference between the modified reference trace and the modified measured trace, wherein the difference is calculated by subtraction of the modified reference trace from the modified measured trace.

23. The polishing system of claim 22, wherein the adjusted trace A(x) is calculated such that $$A(x)=(T(x)-S(x)-b)/k$$

where T(x) is the modified measured trace, S(x) is the modified reference trace, and b and k are constants.

24. The polishing system of claim 21, wherein at least the portion of the measured trace applied to the neural network includes a portion corresponding to an edge region of the substrate.

* * * * *